(12) United States Patent
Gallagher et al.

(10) Patent No.: US 10,566,225 B2
(45) Date of Patent: Feb. 18, 2020

(54) SUBSTRATE CONTAINER WITH ENHANCED CONTAINMENT

(71) Applicant: ENTEGRIS, INC., Billerica, MA (US)

(72) Inventors: Gary Gallagher, Austin, TX (US); Stephen Sumner, San Francisco, CA (US)

(73) Assignee: ENTEGRIS, INC., Billerica, MA (US)

( * ) Notice: Subject to any disclaimer, the term of this patent is extended or adjusted under 35 U.S.C. 154(b) by 69 days.

(21) Appl. No.: 15/743,519

(22) PCT Filed: Jul. 13, 2016

(86) PCT No.: PCT/US2016/042107
§ 371 (c)(1),
(2) Date: Jan. 10, 2018

(87) PCT Pub. No.: WO2017/011564
PCT Pub. Date: Jan. 19, 2017

(65) Prior Publication Data
US 2018/0204751 A1  Jul. 19, 2018

Related U.S. Application Data

(60) Provisional application No. 62/192,011, filed on Jul. 13, 2015.

(51) Int. Cl.
*H01L 21/673* (2006.01)
(52) U.S. Cl.
CPC .. *H01L 21/67366* (2013.01); *H01L 21/67379* (2013.01); *H01L 21/67383* (2013.01); *H01L 21/67386* (2013.01)

(58) Field of Classification Search
CPC ......... H01L 21/67366; H01L 21/67379; H01L 21/67383; H01L 21/67386
USPC .......................... 206/521–594, 832, 701–717
See application file for complete search history.

(56) References Cited

U.S. PATENT DOCUMENTS 4,779,732 A * 10/1988 Boehm .............. G11B 33/0444
206/454
5,711,427 A 1/1998 Nyseth
5,788,082 A 8/1998 Nyseth
(Continued)

FOREIGN PATENT DOCUMENTS

JP  S51-128804   11/1976
JP  2008/060297  3/2008
(Continued)

*Primary Examiner* — Chun Hoi Cheung
(74) *Attorney, Agent, or Firm* — Entegris, Inc.

(57) ABSTRACT

Substrate containers and/or portions thereof for use in the semiconductor manufacturing industry can be formed by injection molding metal slurries. More particularly, such substrate containers and/or portions thereof can be formed by injection molding metal slurries containing magnesium or magnesium alloys. Substrate containers, wherein at least a portion of the substrate container is injection molded from a metal slurry containing magnesium or magnesium alloy can exhibit improved permeation control of moisture and oxygen over, and as compared to, comparable substrate carriers formed of polymer based materials. Exemplary substrate containers can include wafer containers, reticle pods, disk shippers and/or work-in-process boxes.

9 Claims, 5 Drawing Sheets

(56) References Cited

U.S. PATENT DOCUMENTS

| | | | |
|---|---|---|---|
| 5,918,957 A * | 7/1999 | Bovio | G06F 1/1656 312/223.2 |
| 5,979,535 A | 11/1999 | Sakamoto et al. | |
| 6,010,008 A | 1/2000 | Nyseth et al. | |
| 6,079,565 A | 6/2000 | Walsh et al. | |
| 6,082,540 A | 7/2000 | Krampotich et al. | |
| 6,206,196 B1 | 3/2001 | Krampotich et al. | |
| 6,267,245 B1 | 7/2001 | Bores et al. | |
| 6,328,530 B1 * | 12/2001 | Kato | A47L 5/22 148/243 |
| 6,354,601 B1 * | 3/2002 | Krampotich | H01L 21/67376 206/710 |
| 6,428,729 B1 | 8/2002 | Bhatt et al. | |
| 6,446,558 B1 | 9/2002 | Peker et al. | |
| 6,550,619 B2 | 4/2003 | Bores et al. | |
| 6,619,370 B2 | 9/2003 | Sakamoto et al. | |
| 6,736,268 B2 | 5/2004 | Nyseth et al. | |
| 6,771,490 B2 | 8/2004 | Peker et al. | |
| 6,787,899 B2 * | 9/2004 | Rinella | B22D 17/007 257/712 |
| 6,818,078 B2 | 11/2004 | Kim et al. | |
| 6,825,916 B2 * | 11/2004 | Wiseman | G03B 21/62 206/454 |
| 6,843,496 B2 | 1/2005 | Peker et al. | |
| 6,848,578 B2 * | 2/2005 | Eggum | F16J 15/025 206/454 |
| 6,857,524 B2 | 2/2005 | Duban-Hu et al. | |
| 6,875,293 B2 | 4/2005 | Peker | |
| 6,887,586 B2 | 5/2005 | Peker et al. | |
| 6,994,217 B2 | 2/2006 | Duban-Hu et al. | |
| 7,008,490 B2 | 3/2006 | Peker | |
| 7,017,645 B2 | 3/2006 | Johnson et al. | |
| 7,040,487 B2 | 5/2006 | Zabka et al. | |
| 7,059,475 B2 | 6/2006 | Zabka et al. | |
| 7,059,476 B2 | 6/2006 | Kunii et al. | |
| 7,139,066 B2 | 11/2006 | Wiseman et al. | |
| 7,157,158 B2 | 1/2007 | Collier et al. | |
| 7,183,140 B2 | 2/2007 | Davidson | |
| 7,237,594 B2 | 7/2007 | Czerwinski | |
| 7,252,199 B2 | 8/2007 | Johnson et al. | |
| 7,255,151 B2 | 8/2007 | Czerwinski | |
| 7,293,599 B2 | 11/2007 | Peker et al. | |
| 7,400,383 B2 | 7/2008 | Halbmaier et al. | |
| 7,450,219 B2 | 11/2008 | Matsutori et al. | |
| 7,469,738 B2 | 12/2008 | Czerwinski et al. | |
| 7,500,987 B2 | 3/2009 | Bassler et al. | |
| 7,560,001 B2 | 7/2009 | Peker | |
| 7,575,040 B2 | 8/2009 | Johnson | |
| 7,578,404 B2 | 8/2009 | Ekkert | |
| 7,588,071 B2 | 9/2009 | Kang | |
| 7,604,876 B2 | 10/2009 | Collier et al. | |
| 7,607,543 B2 | 10/2009 | Gregerson et al. | |
| 7,886,910 B2 * | 2/2011 | Bores | H01L 21/67373 206/710 |
| 7,967,147 B2 | 6/2011 | Mimura | |
| 8,057,530 B2 | 11/2011 | Kusleika et al. | |
| 8,146,623 B2 | 4/2012 | Tieben et al. | |
| 8,231,005 B2 | 7/2012 | Kolbow et al. | |
| 8,267,149 B2 | 9/2012 | McCullough | |
| 8,276,759 B2 | 10/2012 | Bores et al. | |
| 8,556,987 B2 | 10/2013 | Hunter et al. | |
| 8,613,359 B2 | 12/2013 | Kolbow et al. | |
| 8,734,698 B2 | 5/2014 | Bhatt et al. | |
| 8,833,432 B2 | 9/2014 | Waniuk et al. | |
| 8,881,907 B2 | 11/2014 | Yamagishi et al. | |
| 2006/0243620 A1 * | 11/2006 | Odashima | H01L 21/67346 206/405 |
| 2006/0254747 A1 | 11/2006 | Ishida et al. | |
| 2009/0321037 A1 | 12/2009 | Lewis et al. | |
| 2010/0206767 A1 * | 8/2010 | Odashima | H01L 21/67353 206/710 |
| 2011/0070429 A1 * | 3/2011 | Rochester | C09D 5/084 428/336 |
| 2012/0140143 A1 * | 6/2012 | Wurzel | G02F 1/1333 349/62 |
| 2012/0276402 A1 | 11/2012 | Kitamura et al. | |
| 2013/0001114 A1 | 1/2013 | Anderson et al. | |
| 2013/0010435 A1 * | 1/2013 | Ogatsu | H05K 9/0032 361/748 |
| 2013/0025814 A1 | 1/2013 | Demetriou et al. | |
| 2014/0183076 A1 | 7/2014 | Kolbow et al. | |
| 2014/0193662 A1 | 7/2014 | Chiang et al. | |
| 2014/0264999 A1 | 9/2014 | Bhatt | |
| 2014/0284019 A1 | 9/2014 | Kang et al. | |
| 2014/0287176 A1 | 9/2014 | Galloway | |
| 2015/0014882 A1 | 1/2015 | Darnell | |

FOREIGN PATENT DOCUMENTS

| | | |
|---|---|---|
| JP | 2009259951 | 11/2009 |
| JP | 2011086775 A | 4/2011 |
| JP | 2011103391 A | 5/2011 |
| KR | 10-2014-0099690 A | 8/2014 |
| KR | 200474198 Y1 | 8/2014 |
| KR | 20180020304 A | 2/2018 |
| TW | 201708081 A | 3/2017 |
| WO | 2017011564 A1 | 1/2017 |

* cited by examiner

SUBSTRATE CONTAINER WITH ENHANCED CONTAINMENT

CROSS-REFERENCE TO RELATED APPLICATION

This application claims the benefit of U.S. Provisional Patent Application No. 62/192,011, filed on Jul. 13, 2015, the disclosure of which is hereby incorporated by reference in its entirety.

FIELD OF THE DISCLOSURE

The disclosure relates generally to substrate containers used in semiconductor manufacturing, such as silicon wafer containers and reticle containers.

BACKGROUND OF THE DISCLOSURE

Semiconductor wafers that are manufactured into integrated circuits including computer chips are subjected to numerous steps during processing in various pieces of processing equipment. The wafers must be transported from workstation and often must be temporarily stored in order to accommodate the necessary processing steps. Moreover, the wafers must sometimes be transported or shipped from a wafer manufacturing facility to another site where they are further processed. This is often accomplished by using substrate containers.

Many operational performance requirements are associated with such containers. Generally, such containers need to have an optimal combination of strength, robustness, weight, tolerance control, and cost effectiveness. They may be transported by overhead machinery, they may be washed and reused, they may be opened and closed hundreds of times, and they may be loaded and unloaded hundreds of times.

The containers used for storing 300 mm wafers in between processing steps are known as FOUPs (Front Opening Unified Pods) and the containers conventionally used for shipping 300 mm wafers between facilities are known as FOSBs (Front Opening Shipping Boxes). FOUPs and FOSBs each have a shell with an open interior and shelves in the shell for holding a spaced stack of wafers. Kinematic coupling is provided on the bottom for precisely interfacing with equipment. A front opening in the shell receives a door. The door has a seal to hermetically seal to the shell and a latch mechanism to secure the door in the shell.

Almost all of the components, with the exception of fasteners in some brands, are formed of injection molded polymeric components. Most manufacturers have avoided metal fasteners and metals entirely where possible in wafer containers due to contamination concerns. The substrate containers formed entirely or substantially of polymers have proven to be cost effective and are universally used in the semiconductor industry.

However, polymer-based containers, particularly wafer containers have proven to have certain drawbacks that have to be managed. For example, as semiconductors have become larger in scale, that is, as the number of circuits per unit area has increased, and as wafers have become larger, contaminants have become more of an issue. Contaminants may be particles or airborne molecular contaminants (AMC's) including VOC's (volatile organic compounds). Elimination of metals and use of specialty polymers and other means have addressed the particle contaminant issues. With respect to AMC's, polymers have a tendency to absorb and release moisture and other AMC's. Continual purging of containers has offered a partial solution but purging is not always available, such as when wafers are shipped.

Further, wafers being manufactured into integrated circuits are also sensitive to electrostatic discharge. Electrostatic dissipation ("ESD") of components involved in handling and storing semiconductor substrates is often required or desired. Conventional polymers do not provide this characteristic and additives and/or special formulations must be utilized. This raises the cost of the polymers and can add to contamination issues as well as changing the molding and other characteristics of the polymers.

Moreover, injection molding containers with the large expanses of polymer walls require precisely controlled wall thickness, process controls, and often supplemental structure for strength, shape stability and dimensional stability. That is, wall thicknesses cannot vary dramatically in different portions of, for example the shell, as cooling after molding will typically cause undesired/uneven shrinkage and shape deformation. Even where there are very tightly controlled processes, molds for polymer products have to be over sized to provide the desired size of the final polymer component, which will be dimensionally different than the mold. Thus, the larger expansive components, such as the shells in FOUPs and FOSBs, have uniform wall thicknesses throughout. Additionally, thin polymer walls are fragile. Drawing a vacuum in polymer containers is generally not considered practical. However, certain polymers have characteristics that make them desirable for substrate containers, particularly containers for larger substrates, such as the FOUPs and FOSBs; these polymers, such as fluoropolymers, polyetheretherketones, and liquid crystal polymers, have low particle generation characteristics and reduced VOC absorption rates, but, can be very difficult to mold. The molding issues discussed above, are exacerbated for these polymers.

FOUPs and FOSBs are manufactured in conformance with standards set forth by the industry standards group SEMI (Semiconductor Equipment and Materials International). These standards provide very tight tolerance location requirements for surfaces and features. Molding inaccuracies such as discussed above can render finished molded product as unusable.

SEMI standards also provide positioning of a robotic flange on the top of the FOUPs and FOSBs. The robotic flange is centered coaxially with the center of the spaced stack of wafers contained in the containers. Considering the conventional uniform wall thicknesses of the polymer molded shell, and the additional forward positioned polymer due to the presence of the door frame and door at the forward part of the container, when such containers are supported and transported by their robotic flange, the forward portion of the container is much heavier than the rearward portion. This shifts the center of gravity forward imparts is a moment to the flange and transport system connection urging the front of the containers downward when they are suspended from above. Such can have a detrimental effect, particularly during overhead transport of the containers, causing, for example, high stress points on the robotic flange and stress on the transport system, potentially leading to failure of the connection or transport anomalies. One known way to address this issue is with separate ballast weights added rearwardly on the containers. (See U.S. Pat. No. 8,881,907.)

Generally during transport and handling, it is desirable to minimize vibration and any shock events as such may tend to generate and/or launch particles within the substrate container. Any improvement of such vibration and shock absorption and/or minimization of same would be welcome.

To the extent that these problems may be overcome and performance improved while still providing a cost effective solution would be welcomed by the semiconductor processing industry.

SUMMARY OF THE DISCLOSURE

Storage and/or transport containers for substrates used in semiconductor manufacturing ("substrate containers") are manufactured by injection molding polymer components and injection molding containment components, with semisolid metals, such as magnesium alloys, suitably coating the containment components, and the components are assembled into a substrate container. In front opening wafer containers, such as FOUPs and FOSBs, the containment components may be a shell, commonly called the container portion, as well as the door, or a portion of the door facing the interior of the container. Polymer components are suitably utilized for portions such as latch portions, the overhead robotic flange, manual handles, wafer shelves and/or restraints, the base portion and/or portions providing a kinematic coupling at the bottom of the container and purge components such as fittings, towers, and purge ports. In certain portions the injection molded metal component may be connected with polymer components by fasteners, or by snap fit engagements, or the polymer may be overmolded onto the metal component. Additionally, gaskets and seals may be added to the metal components by way of form-in-place processes.

A feature and advantage of embodiments of the invention is that containment components may be molded with minimal shrinkage after removal from the mold, that is the mold may be constructed with the cavity being essentially the same size as the intended product or much closer thereto than in injection molding polymers. Moreover, wall thicknesses can be varied throughout the containment component. Additionally, containment walls may be made sufficiently strong to draw a partial vacuum in the interior. A feature and advantage of embodiments of the invention, particularly for FOUPs, FOSBs, and other containers with overhead transport robotic flanges, a shell mold for the magnesium alloy may be designed to provide inherent concentration of weight rearwardly, thereby offsetting the forward door related mass and providing an inherently balanced substrate container that does not need supplemental ballast.

A feature and advantage of embodiments of a substrate container formed of injection molded magnesium is that the container is sufficiently strong such that a vacuum may be drawn in the interior providing an enhanced storage environment. Sealing may be provided such that a vacuum of $1.0 \times 10^{-7}$ torr is available. Additionally, relative humidity control of less than 5% may be maintained for 6-12 hours along with a low oxygen (O2) level of less than 100 ppm for 6-12 hours. Such is advantageous in wafer containers, reticle pods, and magnetic disc containers.

A feature and advantage of a composite metal substrate container in embodiments of the invention, is a conductive coating provided to a magnesium alloy containment component. The conductive coating isolates the magnesium alloy from the environment and provides an electrostatic dissipation characteristic to the containment component. Magnesium alloy components do not inherently possess such a characteristic. In embodiments, the containment component is a shell of a front opening wafer container and has a kinematic coupling on a bottom plate, the kinematic coupling formed of an electrostatic dissipative material, the bottom plate and shell being conductively connected together. In embodiments, shelves in the shell are static dissipative and are conductively connected to the conductive shell and base plate.

A substrate container having at least a portion being formed of a magnesium thixomolded material is disclosed. The substrate container or portion includes a coating for resistance to corrosion applied to surfaces of the magnesium thixomolded material. In some embodiments, the coating is a conversion coating. In accordance with various embodiments, the substrate container can be configured as a wafer container, a reticle pod, a disk shipper and a work-in-process box.

In some embodiments, at least a portion of the substrate container is formed of an ejected polymer composition. The ejected polymer may be ejected by a moving nozzle directly on a surface of the portion of the substrate container. The magnesium thixomolded portion and the ejected polymer are bonded in the construction of the substrate container. The ejected portion may be a gasket or seal, for example between the door and the shell.

In various embodiments, the substrate container is configured as a reticle container or pod. As disclosed herein, a portion or parts of the reticle pod or the reticle pod substantially can be formed of magnesium thixomolded material.

In various embodiments, the substrate container is configured as a wafer carrier having a container shell portion with a front opening and a door sealably insertable and removable therefrom and structural elements suitable for transporting a plurality of semi-conductor wafers. As disclosed herein, a portion of the wafer carrier or the wafer carrier substantially can be formed of magnesium thixomolded material. In some embodiments, the container shell portion of the wafer carrier comprises a molded polymer material and the door or a portion thereof comprises the magnesium molded material. The design of some embodiments of such wafer carriers has a center of gravity positioned such that the substrate container, when empty and sitting on a level surface, resists tipping. In some embodiments, the center of gravity is centrally located in the substrate container.

In some embodiment, the substrate container is a wafer carrier having a container shell portion including a wall, a front opening and a door sealably insertable and removable therefrom. The container shell portion is substantially formed of the magnesium thixomolded material. In some embodiments, the wall of the shell portion has a thickness of about 2 mm (±10%), and in various embodiment, the shell portion further has volume of about 57 in$^3$ (±10%). In embodiments, the door, or a portion thereof, is further formed of the magnesium thixomolded material. The door interfaces with the shell portion and in embodiments, an elastomeric seal is provided, on a periphery of the door.

The present disclosure further includes a method of forming a substrate container. In the method, an amount of magnesium alloy is prepared for thixomolding and introduced into an extruder. The magnesium alloy is heated and shear is applied, forming a slurry. The slurry is injected at high speed into a mold forming the substrate container or a component thereof. The substrate container or component is coated for resistance to corrosion. In some embodiments, the coating is a conversion coating.

The substrate container may be configured as an article chosen from the group consisting of a wafer carrier, a reticle pod, an EUV reticle pod, a disk shipper and a work-inprocess box. In an EUV reticle pod, the internal pod and/or the external pod may be formed of injection molded metal, in particular thixomolded magnesium. In some embodiments, the substrate container is configured as a reticle pod. In some embodiments, the substrate container is configured as a wafer carrier having structural elements suitable for transporting a plurality of semi-conductor wafers.

In some embodiments, the substrate container is a wafer carrier having structural elements suitable for transporting a plurality of semi-conductor wafers and a container shell portion, a front opening and a door component sealably insertable and removable therefrom. In some embodiments, the method includes magnesium thixomolding the container shell portion, or portions thereof, the door component, or portions thereof, or combinations thereof. After formation, the container shell portion and the door component are connected and combined. The magnesium thixomolded material portions are further coated with a conversion coating.

In some embodiments, the method comprises forming the door or interior facing portions thereof. The door is connected and combined with the shell portion of the wafer carrier. In some embodiments, the shell is also formed in part or substantially of magnesium thixomolded material. In some embodiments, the substrate container is constructed such that the wafer container has a center of gravity substantially in alignment with the axis of wafers stacked in the container. In this context, substantially means within 10% of the forward to backward length of the wafer container Articles in embodiments of the invention may include substrate containers, such as, but not limited to, wafer carriers, reticle pods, shippers, chip trays, and head trays (read and/or write). In some embodiments, the substrate container is formed having slots for the support of a wafer, wherein the slots comprise wafer contact points. In some embodiments, magnesium in the magnesium thixomolded substrate containers or portions thereof is present in the magnesium thixomolded material in a concentration of 98 percent by weight or more. Substrate containers disclosed herein can further be configured to accommodate 300 mm or 450 mm wafers.

In some embodiments, magnesium molded articles can be used in combination with a variety of engineering and structural plastics conventionally used for substrate containers used in the semi-conductor manufacturing industry.

In some embodiments of the disclosed substrate carriers, the magnesium thixomolded substrate carriers exhibit improved permeation control of moisture and oxygen over and as compared to known substrate carriers formed of polymer-based materials. This can provide the benefit of reducing the need for conventional monitoring and detection of harmful trace gases impacting integrated circuit yield in FOUP's.

In various embodiments of the invention, the magnesium thixomolded substrate carriers or portions thereof are of low weight and have proportionally higher strength as compared to known substrate carriers, or parts thereof, formed of polymer-based materials. The characteristic of lighter weight and improved strength of the formed material of the substrate containers provides further advantages. As an example, due to the lighter weight and stronger (less flexure) compositions of embodiments of the invention, higher speed AMHS (Automated Material Handling Systems) technologies can be realized and safety of both factory personnel and the payload within the carrier being transported, such as reticles and wafers, can be increased. In embodiments where the container holds a vacuum, the low weight and proportionally higher strength of magnesium thixomolding permits affordability and transportability in higher volume production.

In some embodiments, advantages provided by embodiments of the invention can include reducing or limiting yield loss in the manufacturing of devices from, reducing or limiting haze or other clarity defects in carried or stored reticles by maintaining lower moisture, substantially eliminating oxygen permeation as compared to known polymer wafer carriers or reticle carriers; reducing or eliminating cross-contamination from off-gassing within the controlled sealed wafer, reticle, or other sensitive substrate environment.

The above summary of the various representative aspects of the disclosure is not intended to describe each illustrated aspect or every implementation of the disclosure. Rather, the aspects are chosen and described so that others skilled in the art can appreciate and understand the principles and practices of the disclosure.

Still other objects and advantages of the present disclosure and methods of formulation and construction of the same will become readily apparent to those skilled in the art from the following detailed description, wherein only the preferred embodiments are shown and described, simply by way of illustration of the best mode contemplated of carrying out the disclosure. As will be realized, the disclosure is capable of other and different embodiments and methods of construction, and its several details are capable of modification in various obvious respects, all without departing from the disclosure. Accordingly, the drawings and description are to be regarded as illustrative in nature, and not as restrictive.

Figure 1:
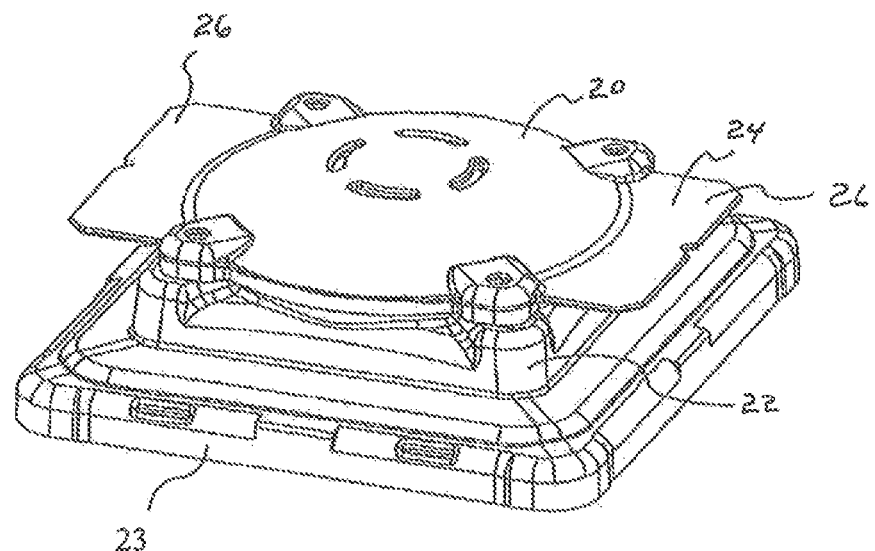
FIG. 1 is a front perspective view of a reticle pod according to an embodiment of the invention herein.

While the present disclosure is amenable to various modifications and alternative forms, specifics thereof have been shown by way of example in the drawings and will be described in detail. It should be understood, however, that the intention is not to limit the present disclosure to the particular aspects described. On the contrary, the intention is to cover all modifications, equivalents, and alternatives falling within the spirit and scope of the present disclosure as defined by the appended claims.

DETAILED DESCRIPTION

While this disclosure may be embodied in many different forms, there are described in detail herein specific embodiments of the disclosure. This description is an exemplification of the principles of the disclosure and is not intended to limit the disclosure to the particular embodiments illustrated. For the purposes of this disclosure, like reference numerals in the figures shall refer to like features unless otherwise indicated.

Substrate containers of the present disclosure are processed directly by injection molding using magnesium alloys (magnesium injection molding or magnesium thixomolding). As an example, FIGS. 1 to 7 depict a variety of exemplary conventional substrate containers that might be formed using methods according to the present invention.

Referring to FIGS. 1-6, several different configurations of substrate containers are illustrated. FIG. 1 illustrates a reticle pod 20 having containment components of an upper shell portion or cover 22 with a bottom opening and a base 23 or door sealably insertable into the bottom opening of the upper shell portion or cover 22. The shell portion 22 includes a top portion configured as a flanged dome portion 24 with handles 26. See, for example, various reticle pod configurations and methods of making and use in U.S. Pat. Nos. 8,613,359; 8,231,005; 8,146,623; 7,607,543; 7,450,219; 7,400,383; 7,139,066; 6,825,916, and U.S. Patent Publication 20140183076, all owned by the owner of the instant application, for further disclosure of reticle pods. See also relevant incorporated patents and/or publications listed below. Said patents and publication are incorporated herein by reference, in their entireties for all purposes, including reticle pod configurations and parts and methods of making and use.

Figure 2:
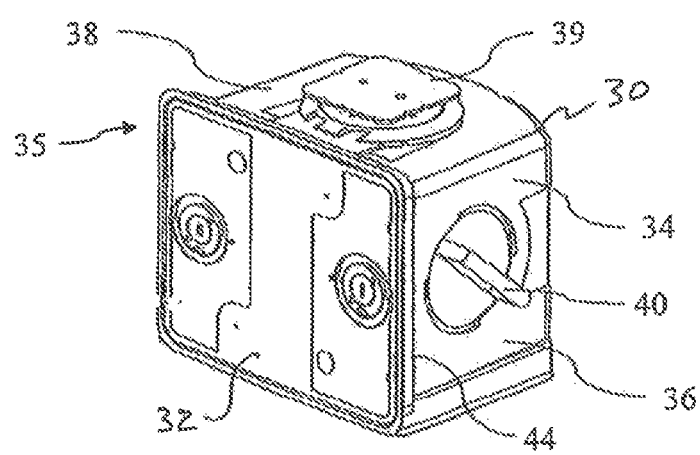
FIG. 2 is a front perspective view of a front opening wafer container according to an embodiment of the invention herein.
Figure 2A:
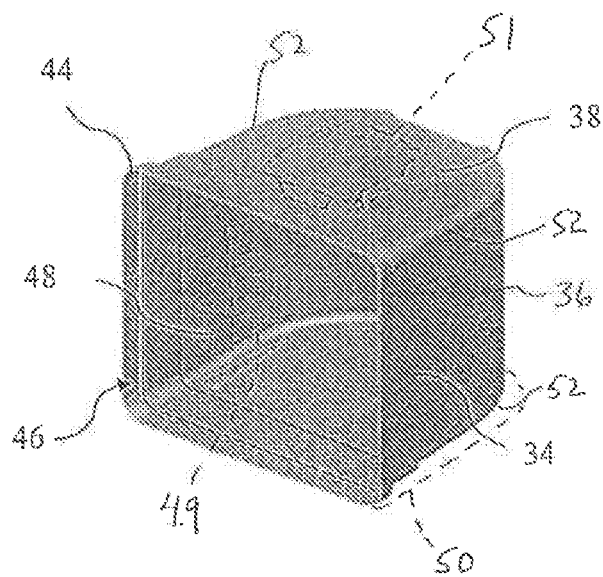
FIG. 2A is a front perspective view of a front opening wafer container shell according to an embodiment of the invention herein.
Figure 2B:
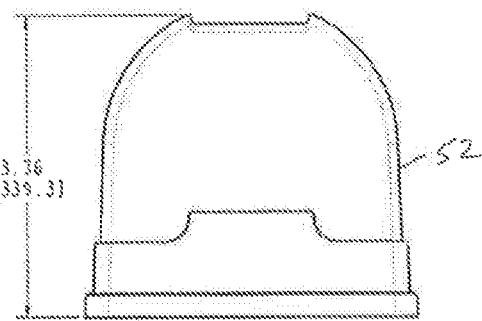
FIG. 2B is a plan view of the front opening wafer container shell of FIG. 2A.
Figure 2C:
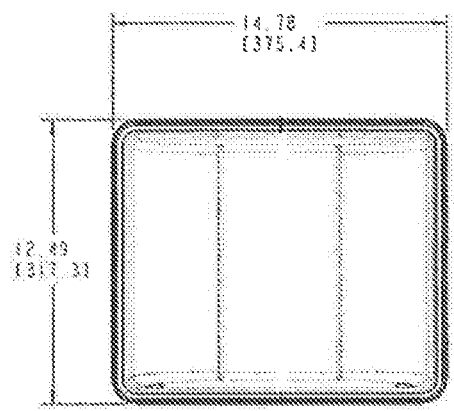
FIG. 2C is a front elevational view of the front opening wafer container shell of FIG. 2A.
Figure 2D:
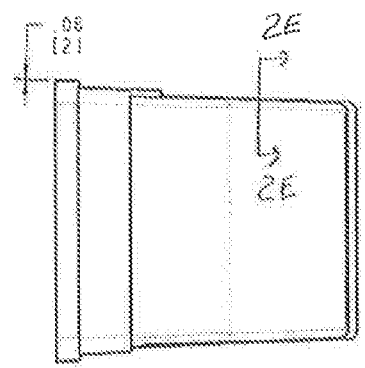
FIG. 2D is a side elevational view of the front opening wafer container shell of FIG. 2A.
Figure 2E:
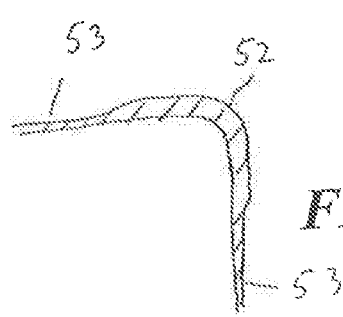
FIG. 2E is a cross sectional view of the corner portion and wall portions taken at line 2E-2E of FIG. 2D.

Referring to FIG. 2, a wafer container or wafer carrier, such as a FOUP according to embodiments of the invention is depicted and is principally comprised of a containment portion configured as an enclosure portion 30 for holding wafers and a door 32 sealably insertable therein and removable therefrom. Referring to FIGS. 2-2E, the enclosure portion 30 comprises a shell 36 having a top 38, a pair of sides 34, 35, a bottom, a door frame 44, a robotic lifting flange 39, side handles 40, and an open front 46 and interior 48. The door 32 generally includes a frame structure, an outside surface and an inside surface. As shown in the incorporated patents and publications door 32 can include various formed portions and connected or bonded parts, fixed or passive and movable or active, that function in the sealing of the FOUP, such as, for example, wafer restraints, latch mechanisms and compartments, and key slots. Carriers and carrier portions of the present disclosure can exhibit ultra-thin wall capability and have thinner wall sections with equal to or better strength and stiffness than conventional carrier walls formed of plastics. FIGS. 2A-D illustrates a FOUP or FOSB shell formed by such magnesium injection molding methods. As an example, the illustrated FOUP or FOSB shell that is thixomolded and coated may have the dimensions (±10%) illustrated in FIGS. 2A-D and a wall thickness of about 2 mm (±10%). In embodiments, the FOUP or FOSB may have a wall thickness of about 1 mm±10%). FOUP or FOSB shells, such as the one shown in FIGS. 2A-D, can further have a material volume of about 57 in$^3$ (±10%). As depicted in FIG. 2A components, such as polymer injection molded wafer supports 49, polymer injection molded conveyor 50 and/or kinematic coupling plate 50, and a polymer injection molded robotic flange 51, may be attached to the shell. In other embodiments, some or all of the above components may be formed of magnesium.

Referring to FIG. 2E, in embodiments, portions of walls may be thinner than other portions. For example, corner portions 52 can be thicker than wall portions 53 that are displaced from the corner portion. The wall portions may be at least 20% less thick, in embodiments at least 30% less thick, in embodiments, at least 50% less thick, in embodiments, at least 65% less thick. In such embodiments, the corner portions and wall portions are unitary with each other. This allows great flexibility in designs and allows shifting of the CoG forward simply by varying wall thicknesses.

Further disclosure on such containers may be found in U.S. Pat. Nos. 8,276,759, 7,886,910, 7,578,404, 7,059,475, 7,040,487, 6,848,578, 6,825,916 6,736,268, 6,550,619, 6,354,601, 6,267,245, 6,206,196, 6,082,540, 6,010,008, 5,788,082 and 5,711,427 owned by the owner of the instant application. See also relevant incorporated patents and/or publications listed below. Said patents and publication are incorporated herein by reference, in their entireties, for all purposes, including wafer container or wafer carrier configurations and parts and methods of making and use.

Figure 3:
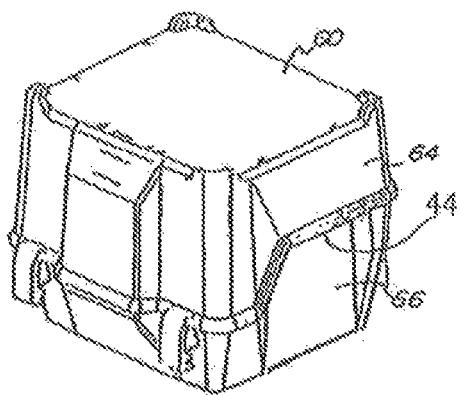
FIG. 3 is a front perspective view of a wafer container according to an embodiment of the invention herein.
Figure 4:
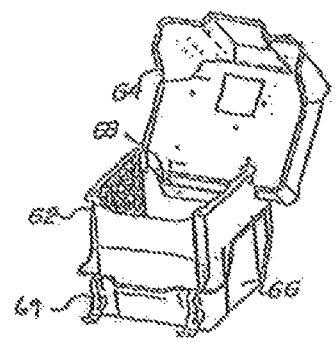
FIG. 4 is a front perspective view of an open front opening wafer container according to an embodiment of the invention herein.
Figure 5:
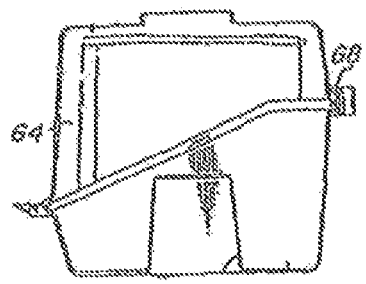
FIG. 5 is a right elevational view of the wafer container of FIG. 3.

FIGS. 3, 4 and 5 illustrate a WIP or work-in-process box 60 that typically include a bottom portion 66, an upper portion 64, a hinge 68, a latch 69, and an H-bar wafer carrier 62 sealed therein.

Figure 6:
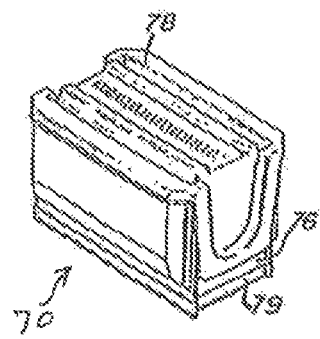
FIG. 6 is a front perspective view of a disk shipper according to an embodiment of the invention herein.
Figure 7:
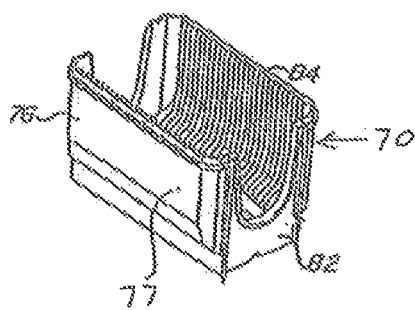
FIG. 7 is a front perspective view of the cassette portion of the disk shipper of FIG. 6.

FIGS. 6 and 7 illustrate a disk shipper 70 for substrates used in hard disk drives and has a cassette or base 76, side walls 77, a top cover 78, a bottom cover 79, end walls 82, and slots 84 in the cassette. Further disclosure on such containers may be found in U.S. Patent and Publication Nos. 8,734,698, 7,252,199, 6,994,217 and 20130001114. Said patents and publication are incorporated herein by reference, in their entireties, for all purposes, including wafer container or wafer carrier configurations and parts and methods of making and use.

Figure 8:
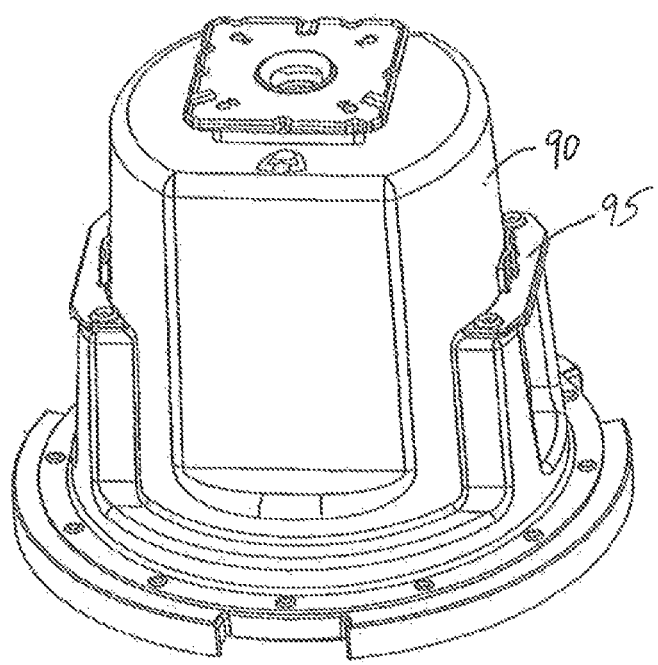
FIG. 8 is a perspective view of a bottom opening pod according to an embodiment of the invention.
Figure 9:
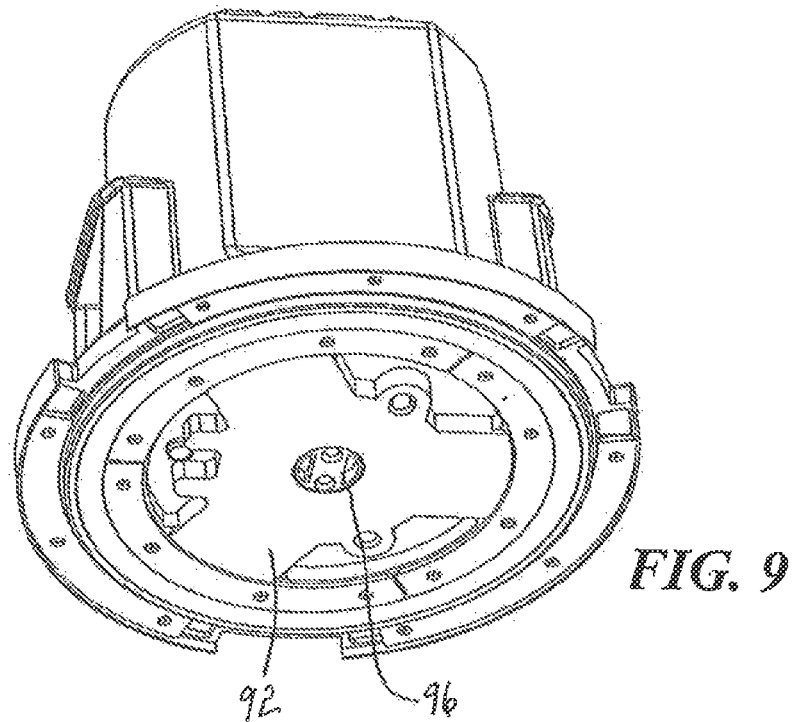
FIG. 9 is an upwardly looking perspective view of the bottom opening substrate container of FIG. 8.

FIGS. 8 and 9 illustrate a bottom opening substrate container comprising a container portion 90 and a door portion 92. The container portion includes a shell 93, handles 94, and a robotic flange 95 and the door portion includes latching mechanism 96.

Figure 10:
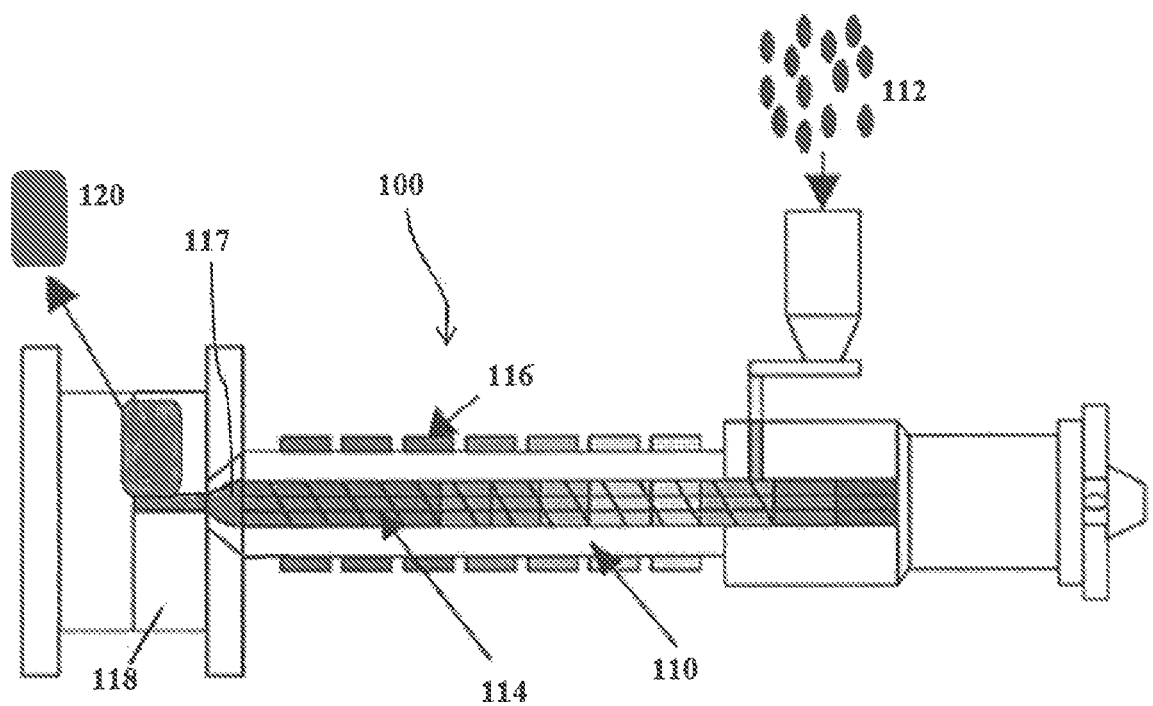
FIG. 10 is a is a schematic side view, partly in section, of a machine injection a thixomolding apparatus.

Magnesium injection molding, also known as magnesium thixomolding and as used herein, is used to form magnesium substrate containers or magnesium components of substrate containers. Magnesium injection molding or magnesium thixomolding is a thixotropic, semi-solid molding process for magnesium. A magnesium thixomolding machine for magnesium (example shown in FIG. 10 at 100) looks much like an injection-molding machine, with a similar clamp for the tool and a screw-based injection barrel 110. The magnesium thixomolding machine differ from conventional injection-molding machines in that they use an inert atmosphere to cover the heated magnesium; temperatures involved are much higher for magnesium versus plastic; and magnesium is injected at much higher speeds than plastic.

In an embodiment, magnesium or magnesium alloy chips 112 are fed at ambient temperature into a heated barrel 110 of an injection-molding machine having a rotating screw 114. The chips 112 are brought to a high temperature via heating elements, for example resistance type heater bands 116, and subjected to high shear forces by the rotating screw 114 of the injection molded machine 100, while maintaining an argon cover atmosphere over the magnesium. The reciprocating screw 114 works the material into a thixotropic (gel-like) state, a slurry 117 of spheroidal solid particles within a molten matrix.

The slurry is then injected into a pre-heated substrate container mold or die 118 at a high rate and under high pressure. The magnesium semi-solid slurry flows thixotropically into the mold 118 under the extreme injection pressure. The slurry is then held under pressure and cooled to form the high precision net or near net shaped substrate containers 120 of the present invention.

A feature and advantage is that the slurry has a low viscosity, allowing it to run quickly and uniformly completely into all the mold's smaller spaces resulting in tight tolerance and a full dense container or container portion that requires little post molding finishing/processing. A feature and advantage is that the fluidity of the magnesium slurry and the low viscosity and the improved rigidity of the material over polymer materials allows for the formation of small pieces and surface structures beyond conventional polymer materials. For example, parts of substrate container enclosure, cover and/or door that are fixed or passive that otherwise would be connected or bonded post-molding, can be in integrally formed in the container enclosure, cover and/or door.

The feedstock for the magnesium compositions used in the magnesium injection molding process can be in the form of magnesium chips, which are commercially available. An example of suitable material includes cast magnesium alloy, such as Thixomolding AZ-91-D. In some embodiments, the magnesium compositions and the molded article can comprise in a concentration of 98 percent by weight or more of magnesium. In some embodiments, the magnesium compositions can be blended, combined with or include as an alloy 2 percent by weight or less non-magnesium material, such as, for example, alloy materials including non-ferrous metals, such as aluminium, copper, aluminum, zinc, manganese, silicon, copper, rare earths, zirconium and combinations thereof.

In accordance with at least some embodiments of the disclosed methods, the formed substrate container can be coated or finished with a coating or finishing suitable for the environments discussed herein. In some embodiments, the tool may also be finished to a polished surface as in an injection-molded tool. The molded carrier part can be finished with compatible finishes that provide for corrosion protection, wear resistance and/or electrical insulation. In some embodiments, a conversion coating is applied to the cleaned magnesium surface to ensure good adhesion. Conversion coatings involve applying a suitable finish that reacts with and converts part of the magnesium surface to the coating. Examples of suitable finishes for magnesium molded carriers or carrier portions include commercially available Alodine 5200 (Non Chromate); Alodine (trademark of the Henkel Corporation) 5900 (Trivalent Chromate); Metalast TCP-HF (Metalast is a trademark of Metalast Surface Technology, LLC) available from NALTIC Industrials, LLC; NH35 (Hexavalent Chromate); Tagnite (a trademark of Technology Applications Group Inc.); Anomag (a trademark of Keronite International Limited Company); and Keronite (a trademark of Keronite International Limited). In some embodiments, coatings can further include, generally, e-coating, powder coating, electroless nickel, chrome, urethanes, UV-cured coatings and anodizing. Such coatings can allow for improved attachment and connectability to other pieces and form in place capabilities, specifically overmolding or form in place molding features and components to the magnesium molded carrier part. Coatings can also improve outgassing performance over traditional polymers used in contamination substrate containers.

Coated substrate containers of the present invention exhibit increased resistance to corrosion, increased surface hardness. In some embodiments, the coatings may be very thin, for example a few hundred thousandths of an inch.

Further finishing processes can include electrostatic discharge machining (EDM), chemical milling, ablation or laser cutting.

In some embodiment, formed articles of the present disclosure can include articles used as transport and storage enclosures for substrates used in semiconductor manufacturing. Such articles can include substrate containers/containers, examples of which are shown in the figures and include: wafer carriers (FOUP's), reticle pods and disk shippers, WIP boxes, chip trays, and the like. Further specific examples of articles include 300 mm/450 mm EBM FOUPs/Reticle Pods/EUV Pods.

In some embodiments, portions of carriers are magnesium thixomolded in combination with portions formed conventionally using extrusion molded polymer compositions. One of ordinary skill in the art would have knowledge of such polymer compositions and conventional molding processes. Patents and publications incorporated herein provide further guidance and disclosure. Examples of suitable polymer compositions include a polymer selected from the group consisting of polybutylene terephthalate (PBT), polyolefins (PO), polyethylene terephthalate (PET), styrene block copolymers, styrene-butadiene rubber, nylon in the form of polyether block polyamide (PEBA), polyetheretherketone (PEEK), poly(vinylidenefluoroide), poly(tetrafluororethylene) (PTFE), polyethylene, polypropylene, poly(vinylchloride) (PVC), ethyl vinyl acetate and blends and copolymers thereof. Such polymers may include carbon nanotubes mixed throughout the polymer.

As an example, in some embodiments, a FOUP is constructed, wherein the container portion is formed conventionally using extrusion molded polymer compositions and the door is form using the magnesium thixomolding processes herein. This combination has the benefit of centralizing the center of gravity ("CoG") of the FOUP allowing an empty FOUP to be set down with more stability than conventional FOUPs with the CoG more forwardly positioned. This can make it more difficult for AMHS equipment to handle the carrier at the high speeds required. Materials and methods of embodiments of the invention allow for the formation of doors that have sufficient rigidity under SEMI International Standards and that are lighter so as to improve the carrier CoG.

The methods disclosed herein and fluidity of the magnesium slurry material provide for tight tolerance molding, allowing consistent and accurate dimension tolerances. This equips the formed carriers with high wafer plane/wafer position repeatability. This also provides for form in place (FIP) gasket capability, providing for the ability to create sealed interfaces in wafer and reticle carriers, for example door to shell gasketed interface and purge module gasketed interface. Smaller and more intricate pieces or portions typically incorporated or connected or bonded to other carrier parts after molding, can also be formed as integral surface structures. For example, parts of substrate container enclosure, cover and/or door that are fixed or passive that otherwise would be connected or bonded post-molding, can be integrally formed in the container enclosure, cover and/or door.

The formed walls of the disclosed carriers and carrier portions also exhibit good dampening characteristics. For example, they can dampen energy input to wafers during manual and automated handling.

EXAMPLES

As an illustration of some improvements of the articles of the present disclosure over conventional thermoplastic articles, a permeation testing comparison was performed between magnesium molded parts in accordance with the present disclosure and injection molded EBM material (a high performance Entegris proprietary polymer) for articles in microenvironment (ME) applications. As can be seen in the process and results description below, the magnesium parts have a roughly an order of magnitude better permeation performance.

Test 1

A first testing was conducted to determine the permeation characteristics of an injection-molded magnesium specimen using hydrogen gas and standard manometric techniques. In a second testing, permeation resistance of hydrogen and oxygen was evaluated on a thermoplastic proprietary resin of Entegris, Inc. known as EBM material.

In the first testing, 38 mil injection-molded magnesium specimens were tested. Hydrogen (from Industrial Grade, Toll Co., Minneapolis, Minn.) was used as the permeant gas. The gas permeation apparatus consisted of a sample holder inside of a temperature-controlled chamber, a series of valves, an upstream ballast tank, a pressure transducer (300 psi Heise PM Digital Indicator) for the upstream gas, and a downstream solid-state manometer (10 Torr MKS Baratron Type 627B). The apparatus was constructed from stainless steel. Connections were made by welding or with VCR flanges to prevent leaks.

Permeation was measured according to standard manometric procedures (D1434-82, Standard Test Method for Determining Gas Permeability Characteristics of Plastic Film and Sheeting, ASTM, West Conshohocken, Pa., 1998. See also JIS K7126.), as described below. A circular specimen with a diameter of 4.6 cm and an effective area (A) of 13.7 $cm^2$ was placed in the gas permeation apparatus. The apparatus was pumped down to approximately 20 mTorr and held overnight to remove volatile constituents from the apparatus as well as from the specimen. The next day, the apparatus was leak tested. If the leak rate was sufficiently low, then the upstream side of the apparatus was charged with the permeant gas.

After pressure and temperatures were allowed to equilibrate for a few minutes, the test was started. The downstream pressure rise ($\Delta p_1$) was recorded with the passage of time. (Temperature and upstream pressure ($\Delta p$) also were monitored over the duration of the experiment to assure their constancy.) All measurements were made at 25° C. (77° F.). Measurements were taken from one thickness (38 mil) using two pressures (2 and 3 atm).

Analysis:

Gases permeate through homogeneous materials by first dissolving and then diffusing. The downstream pressure rise ($\Delta p_1$) of the permeant can be converted to an equivalent volume of gas (V) at standard temperature and pressure (STP), $$V = (\Delta p_1/\Delta p_o)(T_o/T)V_s,$$

where T is the measurement temperature, $V_s$ is the volume of the downstream side of the permeation apparatus, $T_o$ is standard temperature (32° F.=273 K) and $\Delta p_o$ is standard pressure (=1 atm or 76 cmHg). The volume (V) of gas that permeates through a film with time (t) under steady state conditions depends on the permeability coefficient (P), as well as film thickness (B), film area (A) and the applied upstream pressure ($\Delta p$) (4,5), $$V = P \cdot A \cdot \Delta p \cdot t/B.$$

The time required for a permeant to break through a film ($t_b$) depends on the film thickness (B) and the diffusion coefficient of the material, $$t_b = B^2/6D.$$

Solubility coefficients were calculated for permeability and diffusion coefficients as, $$S = P/D.$$

Results:

Permeation rates were proportional to the applied upstream pressure. Accordingly, the data from the two pressures gave unique values of P, D, and S. Table 1 below summarizes mass transfer coefficients of the magnesium specimen. Their overall averages were P=(0.056±0.001)× $10^{-10}$ $cm^3 \cdot cm/cm^2 \cdot s \cdot cmHg$, D=(5.66±0.53)×$10^{-8}$ $cm^2/s$, and S=(0.098±0.010)×$10^{-3}$ $cm^3/cm^3 \cdot cmHg$.

TABLE 1

| Pressures | P ($10^{-10}$ $cm^3 \cdot cm/cm^2 \cdot s \cdot cmHg$) | D ($10^{-8}$ $cm^2/s$) | S ($10^{-3}$ $cm^3/cm^3 \cdot cmHg$) |
|---|---|---|---|
| 2 atm | 0.055 | 6.03 | 0.091 |
| 3 atm | 0.056 | 5.28 | 0.105 |
| Overall averages | 0.056 ± 0.001 | 5.66 ± 0.53 | 0.098 ± 0.010 |

Permeability coefficients (P), diffusion coefficients (D) and solubility coefficients (S) of the hydrogen gas through injection-molded magnesium at 25° C. (77° F.)

The P values are quite low and are more than an order of magnitude larger than the minimum measurable values. The lower limits for hydrogen on this apparatus are shown in Table 2 (testing using ERG 0608-01, Determining the Leak Rate and Capabilities of the Gas Permeation Module).

TABLE 2

| $\Delta p$ (atm) | P ($10^{-10}$ $cm^3 \cdot cm/cm^2 \cdot s \cdot cmHg$) |
|---|---|
| 2.94 | 0.00561 |
| 3.01 | 0.00415 |
| 5.88 | 0.00408 |
| 5.97 | 0.00478 |

Overall averages of permeability coefficients (P) of the hydrogen gas for the aluminum at 25° C. (77° F.)

Test 2:

In a second testing, permeation resistance of hydrogen and oxygen was evaluated on a compression molding of a high performance proprietary polymer. Specimens were compression molded using a PHI Bench Design, Hydraulic Compression Press at a temperature of 280° C. (536° F.). A specified amount of resin was weighed out for various thicknesses of film, poured into the center of a brass plaque mold and then sandwiched between thin aluminum sheets and PI film. This sandwich was placed on the pre-heated lower platen of the press and brought to a "kiss" position with the top platen and held for two minutes, after which a load of 20,000 pounds was applied for one minute. The samples were then cooled either by placing them between two aluminum blocks (7 mil) or by removing them from the press and allowing the specimen to cool slowly at room temperature (12 mil).

Glass transition temperatures ($T_g$) of the EBM resin and the various films were determined using differential scanning calorimetry (Perkin Elmer Diamond DSC). Samples ranging in mass from 4 mg to 8 mg were cut from specimens, heated from 25° C. (77° F.) to 200° C. (392° F.), cooled from 200° C. to 25° C., and then heated again from 25° C. to 200° C. at a rate of 10° C./min (18° F./min). Triplicate DSC scans were performed for each material and film thickness and analyzed.

The permeant gases were Industrial Grade from Toll Co., Minneapolis, Minn. The gas permeation apparatus consisted of a sample holder inside of a temperature-controlled chamber, a series of valves, an upstream ballast tank, a pressure transducer (300 psi Heise PM Digital Indicator) for the upstream gas, and a downstream solid-state manometer (10 Torr MKS Baratron Type 627B). The apparatus was constructed from stainless steel. Connections were made by welding or with flanges to prevent leaks.

Permeation was measured according to standard manometric procedures (D1434-82, Standard Test Method for Determining Gas Permeability Characteristics of Plastic Film and Sheeting, ASTM, West Conshohocken, Pa., 1998. See also JIS K7126.) as described below. A circular specimen with a diameter of 4.6 cm and an effective area (A) of 13.7 cm² was placed in the gas permeation apparatus. The apparatus was pumped down to approximately 20 mTorr and held overnight to remove volatile constituents from the apparatus as well as from the specimen. The next day, the apparatus was leak tested. If the leak rate was sufficiently low, then the upstream side of the apparatus was charged with the permeant gas. After pressure and temperatures were allowed to equilibrate for a few minutes, the test was started. The downstream pressure rise ($\Delta p_1$) was recorded with the passage of time. (Temperature and upstream pressure ($\Delta p$) also were monitored over the duration of the experiment to assure their constancy.) All measurements were made at 25° C. (77° F.). Measurements were taken using three pressures (1, 2, and 3 atm) for the hydrogen gas and two pressures (1 and 2 atm) for the oxygen gas.

Analysis:

Gases permeate through homogeneous materials by first dissolving and then diffusing. The downstream pressure rise ($\Delta p_1$) of the permeant can be converted to an equivalent volume of gas (V) at standard temperature and pressure (STP), $$V = (\Delta p_1/\Delta p_o)(T_o/T)V_s,$$

where T is the measurement temperature, $V_s$ is the volume of the downstream side of the permeation apparatus, $T_o$ is standard temperature (32° F.=273 K) and $\Delta p_o$ is standard pressure (=1 atm or 76 cmHg). The volume (V) of gas that permeates through a film with time (t) under steady state conditions depends on the permeability coefficient (P), as well as film thickness (B), film area (A) and the applied upstream pressure ($\Delta p$)

$$V = P \cdot A \cdot \Delta p \cdot t/B.$$

The time required for a permeant to break through a film ($t_b$) depends on the film thickness (B) and the diffusion coefficient of the material, $$t_b = B^2/6D.$$

Solubility coefficients were calculated for permeability and diffusion coefficients as, $$S = P/D.$$

Results:

Thermal properties of the EBM proprietary polymer were measured for the two thicknesses of film as well as for the resin. Average values are shown in Table 3. These values generally agree with their specifications.

TABLE 3

| Thermal properties for the EBM resin and films.* ||
| EBM | Tg (° C.) |
| --- | --- |
| Resin | 130 ± 1 |
| Film | 130 ± 1 |

*The overall averages and standard deviations shown in the table were computed from the individual measurements of all thicknesses.

A slower cooling method (i.e., room temperature cool) was used in an effort to make the specimens more compliant. Hydrogen was run on both block cooled and room temperature cooled specimens to verify that the different cooling methods did not affect the data. Indeed, both cooling methods gave the same permeation results.

Permeation rates were proportional to the applied upstream pressure and inversely proportional to thickness. For a given gas, the data from the various pressures and thicknesses gave unique values of P, D, and S. Table 4 lists the overall averages for the hydrogen and oxygen gases used on the EBM films compression-molded at Entegris.

TABLE 4

Overall averages of Permeability coefficients (P), diffusion coefficients (D) and solubility coefficients (S) of the hydrogen and oxygen gas for the EBM films at 25° C. (77° F.)*.

| Gas | P ($10^{-10}$ cm³·cm/ cm²·s·cmHg) | D ($10^{-8}$ cm²/s) | S ($10^{-3}$ cm³/ cm³·cmHg) |
| --- | --- | --- | --- |
| H₂ | 9.00 ± 0.56 | 125 ± 23 | 0.73 ± 0.10 |
| O₂ | 0.54 ± 0.03 | 1.98 ± 0.27 | 2.76 ± 0.37 |

*The overall averages and standard deviations shown in the table were computed from the individual measurements of all thicknesses.

Table 5 lists the overall averages of two polycarbonate films, Polycarbonate 1 and low permeation grade films Polycarbonate 2 measured using those same gases. While the EBM showed better permeation resistance than our standard Polycarbonate 1, the low-permeation PC was slightly better than the EBM. The permeation rate of oxygen through EBM was 2 times lower than the Polycarbonate 1.

TABLE 5

Overall averages of Permeability coefficients (P), diffusion coefficients (D) and solubility coefficients (S) of hydrogen and oxygen gases for Polycarbonate films at 25° C. (77° F.).*

| Polymer | Gas | P ($10^{-10}$ cm³·cm/ cm²·s·cmHg) | D ($10^{-8}$ cm²/s) | S ($10^{-3}$ cm³/ cm³·cmHg) |
| --- | --- | --- | --- | --- |
| Polycarbonate 1 | H₂ | 10.9 ± 0.1 | 131 ± 21 | 0.85 ± 0.15 |
|  | O₂ | 1.16 ± 0.02 | 3.83 ± 0.23 | 3.05 ± 0.23 |

TABLE 5-continued

Overall averages of Permeability coefficients (P), diffusion
coefficients (D) and solubility coefficients (S) of hydrogen
and oxygen gases for Polycarbonate films at 25° C. (77° F.).*

| Polymer | Gas | P $(10^{-10} \text{ cm}^3 \cdot \text{cm}/ \text{cm}^2 \cdot \text{s} \cdot \text{cmHg})$ | D $(10^{-8} \text{ cm}^2/\text{s})$ | S $(10^{-3} \text{ cm}^3/ \text{cm}^3 \cdot \text{cmHg})$ |
|---|---|---|---|---|
| Polycarbonate 2 | $H_2$ | 4.10 ± 0.03 | 36.9 ± 2.4 | 1.11 ± 0.08 |
|  | $O_2$ | 0.15 ± 0.01 | 0.35 ± 0.13 | 4.72 ± 1.92 |

*The overall averages and standard deviations shown in the table were computed from the individual measurements of all thicknesses.
** Specimens cooled with ice quench method.
† Specimen allowed to cool in press overnight.

Tables 6-8 shown below summarize the DSC data as well as mass transfer coefficients of the EMB films based on thickness within the method and gas used.

TABLE 6

Thermal properties for the EBM films

| B | | |
|---|---|---|
| (mil) | (mm) | Tg (° C.) |
| 7.0 | 0.18 | 129 ± 1 |
| 12.0 | 0.31 | 130 ± 1 |

* The overall averages and standard deviations shown in the table were computed from the individual measurements of all thicknesses.

TABLE 7

Permeability coefficients (P), diffusion coefficients
(D) and solubility coefficients (S) of the hydrogen
gas through EBM films at 25° C. (77° F.).

| B | | P $(10^{-10} \text{ cm}^3 \cdot \text{cm}/ \text{cm}^2 \cdot \text{s} \cdot \text{cmHg})$ | D $(10^{-8} \text{ cm}^2/\text{s})$ | S $(10^{-3} \text{ cm}^3/ \text{cm}^3 \cdot \text{cmHg})$ |
|---|---|---|---|---|
| (mil) | (mm) | | | |
| 7.0* | 0.18 | 9.41 ± 0.02 | 142 ± 1 | 0.66 ± 0.01 |
| 12.0† | 0.31 | 8.39 ± 0.08 | 101 ± 5 | 0.84 ± 0.04 |
| Overall averages** | | 9.00 ± 0.56 | 125 ± 23 | 0.73 ± 0.10 |

*Specimens cooled with aluminum blocks.
†Specimen cooled room temperatures between metal plates.
**The overall averages and standard deviations shown in the table were computed from the individual measurements of all thicknesses.

TABLE 8

Permeability coefficients (P), diffusion coefficients
(D) and solubility coefficients (S of the oxygen
gas EBM films at 25° C. (77° F.).

| B | | P $(10^{-10} \text{ cm}^3 \cdot \text{cm}/ \text{cm}^2 \cdot \text{s} \cdot \text{cmHg})$ | D $(10^{-8} \text{ cm}^2/\text{s})$ | S $(10^{-3} \text{ cm}^3/ \text{cm}^3 \cdot \text{cmHg})$ |
|---|---|---|---|---|
| (mil) | (mm) | | | |
| 7.0* | 0.18 | 0.547 ± 0.029 | 2.19 ± 0.08 | 2.50 ± 0.22 |
| 12.0† | 0.31 | 0.526 ± 0.018 | 1.76 ± 0.20 | 3.01 ± 0.30 |
| Overall averages** | | 0.537 ± 0.025 | 1.98 ± 0.27 | 2.76 ± 0.37 |

*Specimens cooled room temperatures between metal plates.
†Specimen cooled overnight under pressure.
**The overall averages and standard deviations shown in the table were computed from the individual measurements of all thicknesses.

Permeability, diffusion and solubility coefficients were measured for the Entegris high performance proprietary polymer EBM using two different gases. Specimens molded from the EBM were more pliable than the Polycarbonate 2 but showed some fine cracks at the interface of the o-ring in the sample holder. Results were found to be independent of applied upstream pressure and thickness. The EBM showed better permeation resistance than Polycarbonate 1, the low-permeation Polycarbonate 2 was slightly better than the EBM. The permeation rate of oxygen through EBM was 2 times lower than the Polycarbonate 1. Hydrogen permeated faster than oxygen, primarily due to its smaller molecular size.

Results and Conclusions

Considering the above testing and the measured permeability, diffusion and solubility coefficients, the injection-molded magnesium alloy is far more impervious than the thermoplastics materials. The permeation rate of this injection-molded magnesium alloy is two orders of magnitude less than polycarbonate.

Without being limited by a particular theory or design of the invention or of the scope afforded in construing the claims, it is believed that substrate carries, for example FOUPs, formed from the methods of the present disclosure afford improved performance qualities over conventional polymer carriers and meet requirements desired by users in the field of semiconductor manufacturing.

For example, it is believed that a magnesium thixomolded FOUP, made and coated in accordance with the present disclosure, accommodates or improves over polymer based FOUPs in any, all or combinations of the following performance standards: accommodates a hot wafer insertion temperature of 180° C. to 240° C.; provides repeatable and less variable wafer plane (nominal±0.5 mm (at 10 mm pitch)); provides for a balanced wafer plane (left to right±0.15 mm); meets or exceeds purge performance conditions of 100 lpm (liters per min.) per port maximum (door open less than 5% RH (standard EFEM (equipment front end module—load port) conditions), door open less than 100 ppM (parts per million) 02, door closed less than 5% RH less than 60 seconds) (using purge gas N2, XCDA); accommodates particle efficiency of 99.999% at 0.1 micron at 70 lpm purge, a low oxygen environment of less than 100 ppm at 6 hours minimum, less than 50 ppm at 2 hrs. minimum, and a low moisture environment of less than 5% at 6 hours; accommodates a low VOC emission environment of less than or equal to 200 ppb as shipped (using Adixen APA); improved drying time (less than six minutes) over polymer-based FOUPs in conventional FOUP wash; provides improved wafer level retention and vibration (reduced particle generation and entrapment) over polymer based FOUPs; has wafer retention of 2 N for particle generation after a vertical vibration test; provides improved wafer protection during OHT (overhead transport) lifting of less than 1.6 degrees rotation; provides for non-standard wafer thickness and diameters, including Thin wafer, 3D wafer, 301 mm and 302 mm wafers; provides improved R1, wafer center within 1.00 mm, and decreased variance between slots (Nominal+); protects against light induced defects; is SEMI standard dimensions capable (end effector and stocker interfaces, rear wall clearances, OHT flange interference, sensor location misses); is ESD (electrostatic discharge) Protection Capability (static dissipative $10^6/10^9$ path to ground less than 0.1 second; consistent with Qualcomm specification); and provides improvement in shell rigidity for sealability and dim control and diffusion to counter variable EFEM conditions over polymer based FOUPs.

Resulting net or near net shape magnesium substrate containers or magnesium components of substrate containers formed by the magnesium injection molding methods herein exhibit, as compared to polymer silicon wafer carriers or reticle carriers, lower weight and higher strength (less flexure), while providing ultra-thin walls, lower porosity/permeability, lower absorption and desorption; high ductility, good damping characteristics, high tolerances, improved surface finish, low flammability; and lower adverse environmental impact in terms of recyclability. Such substrate containers are further characterized in having inherent EMI (electromagnetic interference) shielding, without fillers or additives, and high tolerances.

The characteristic of low porosity/permeability of the formed material of the substrate containers is reflected, for example, in the improved permeation control of moisture and oxygen exhibited by the carriers. With the magnesium alloy form articles, permeation of moisture and oxygen is controlled and kept very low, so as to limit cross-contamination from off-gassing within the controlled sealed wafer, reticle, or other sensitive substrate environment. In contrast, polymer based carriers can absorb moisture. The permeation control of moisture and oxygen exhibited by the carriers has the benefit of reducing the need for conventional monitoring and detection of harmful trace gases impacting integrated circuit yield in FOUP's. Such monitoring and detection is typically performed using quantum cascade laser ("QCL") technology, which increases process costs.

embodiments, the substantial uniform surface resistivity of any point on the surface of an article is within a factor of 100 and in some embodiments within a factor of 10 from any other test point on the article. This is advantageous in electrostatic discharge applications of the composites in articles such as chip trays, reticle and wafer carriers, wafer shippers and the like.

In general, suitable extruders are available commercially. The extruder can be a single screw extruder or a multiple screw extruder, such as a two screw extruder. Further details regarding suitable extruders and methods of use are found in the incorporated Patents and Patent Publications listed below. One of ordinary skill in the art will recognize that the selection of a particular extruder and molding apparatus can be guided by the intended application of a particular article.

Further disclosure of processing, composition components, concentrations and physical characteristics can be found in the incorporated Patents and Patent Publications listed below. The disclosure, including methods, materials, equipment and articles, in the following U.S. Patent Nos. and U.S. Publication Nos. are incorporated into and may be used in and/or combined with the methods, materials, equipment and articles of the present disclosure and are incorporated herein by reference in their entireties, for all purposes.

| | | | | | |
|---|---|---|---|---|---|
| 20150014882 | 8,613,359 | 7,588,071 | 7,237,594 | 6,857,524 | 6,428,729 |
| 20140287176 | 8,556,987 | 7,578,404 | 7,157,158 | 6,848,578 | 6,354,601 |
| 20140284019 | 8,276,759 | 7,575,040 | 7,139,066 | 6,843,496 | 6,267,245 |
| 20140264999 | 8,267,149 | 7,560,001 | 7,059,476 | 6,825,916 | 6,206,196 |
| 20140193662 | 8,231,005 | 7,500,987 | 7,059,475 | 6,818,078 | 6,082,540 |
| 20140183076 | 8,146,623 | 7,469,738 | 7,040,487 | 6,771,490 | 6,079,565 |
| 20130025814 | 8,057,530 | 7,450,219 | 7,017,645 | 6,736,268 | 6,010,008 |
| 20090321037 | 7,886,910 | 7,400,383 | 7,008,490 | 6,619,370 | 5,979,535 |
| 20060254747 | 7,607,543 | 7,293,599 | 6,887,586 | 6,550,619 | 5,788,082 |
| | 8,833,432 | 7,604,876 | 7,255,151 | 6,875,293 | 6,446,558 | 5,711,427 |

The characteristic of lighter weight and improved strength of the formed material of the substrate containers provides further advantages. The comparatively high strength-to-weight ratio of the improved substrate container material allows for more reliable cargo security. Such improvements further can enable higher speed AMHS (Automated Material Handling Systems) technologies, improving efficiency and increase safety of both factory personnel and of the payload within the carrier being transported (i.e., reticles, wafers, etc.). For example, SEMI International Standards require that doors of particular substrate containers, such as 300 mm carriers for example, have a minimum rigidity. substrate container polymer doors that have sufficient rigidity under SEMI International Standards can have a weight that tends to drive the center of gravity ("CoG") of the substrate container toward the door. This can make it more difficult for AMHS equipment to handle the carrier at the high speeds required. Materials and methods of the present invention allow for the formation of doors that have sufficient rigidity under SEMI International Standards and that are lighter so as to improve the carrier CoG.

Further advantages include lower expense for alloys used in the disclosed magnesium thixotropic injection molded substrate containers than the raw materials used in molding conventional thermoplastic carriers. Also, substrate containers and carriers made from the disclosed methods and compositions can be reused repeatedly, i.e., recycled to form further products without markedly losing the electrically conductive properties, thus lower long term costs.

Embodiments of the present invention provide articles having substantially uniform surface resistivity. In some The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

Additionally, embodiments of the invention include:

A method of forming a wafer container having structural elements configured for transporting a plurality of semi-conductor wafers, the wafer carrier having a container shell portion, a front opening and a door sealably insertable and removable therefrom, the method comprising the steps of: preparing an amount of magnesium alloy material; introducing the amount of magnesium alloy material within an extruder; heating and applying shear to the amount of magnesium alloy to form a slurry; injecting the slurry into a mold forming at least one of the components of the container shell portion and the door portion; and assembling the door and the container shell portion into a wafer container.

The above method, further comprising coating the at least one of the components for resistance to corrosion. The above method, wherein the coating is a conversion coating.

Any of the above methods further comprising configuring the wafer container to hold one of 300 mm and 450 mm wafers.

Any of the above methods further comprising positioning a center of gravity of the wafer container in substantial alignment with an axis of the wafer to be contained therein.

Any of the above methods, wherein the wafer carrier has a centrally located center of gravity.

Any of the above methods, further comprising maintaining the magnesium thixomolded material in a concentration of 98 percent by weight or more.

Further embodiments of the invention can include those described in the following numbered paragraphs:

1. A substrate container formed of injection molded components, components comprising a container portion and a door portion, the container portion having wall thicknesses that varies at least 40% between the thickest wall portion and the thinnest wall portion.

2. A substrate container comprising container portion with a front opening and a door sealably insertable and removable from the container portion, wherein the container shell portion comprises a molded polymer material and the door comprises magnesium thixomolded material.

3. A method of maintaining a substrate enclosure environment with a vacuum of $1.0 \times 10^{-7}$ torr, the method comprising: providing a container with a shell portion comprising: magnesium and a door portion comprising magnesium with a seal at an interface therebetween, and reducing the internal atmosphere to a vacuum of $1.0 \times 10^{-7}$ torr.

4. A method of maintaining a substrate enclosure environment with a relative humidity of less than 5% for 6-12 hours after closing comprising: providing a container with a shell portion comprising magnesium and a door portion formed of thixomolded magnesium with a seal at an interface therebetween.

5. A method of maintaining a substrate enclosure environment with a low oxygen (O2) level of less than 100 ppm for 6-12 hours comprising: providing a container with a shell portion comprising thixomolded magnesium and a door portion comprising thixomolded magnesium with a seal at an interface therebetween.

6. The method of any one of numbered paragraphs 3-5, further comprising providing a plurality of injection molded polymer substrate components and assembling the container containment component with the plurality of injection molded polymer components into a substrate container.

The terminology used herein is for the purpose of describing particular embodiments only and is not intended to be limiting. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

References to "embodiment(s)", "embodiment(s) of the disclosure", and "disclosed embodiment(s)" contained herein refer to the specification (text, including the claims, and figures) of this patent application that are not admitted prior art.

All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment (s). The invention extends to any novel one, or any novel combination, of the features disclosed in this specification (including any incorporated by reference references, any accompanying claims, abstract and drawings), or to any novel one, or any novel combination, of the steps of any method or process so disclosed The above references in all sections of this application are herein incorporated by references in their entirety for all purposes.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative aspects. The above described aspects embodiments of the invention are merely descriptive of its principles and are not to be considered limiting. Further modifications of the invention herein disclosed will occur to those skilled in the respective arts and all such modifications are deemed to be within the scope of the invention.

For purposes of interpreting the claims for the embodiments of the inventions, it is expressly intended that the provisions of 35 U.S.C. 112(f) are not to be invoked unless the specific terms "means for" or "step for" are recited in the respective claim.

The invention claimed is:

1. A substrate container comprising a containment portion of the substrate container being formed of a magnesium thixomolded material, the containment portion having a coating on a surface of the magnesium thixomolded material, wherein the containment portion further comprises substrate supports, a plurality of corner portions, and a plurality of wall portions, wherein each of the plurality of corner portions is defined by a convergence of two wall portions, each of the plurality of wall portions having a portion displaced from a corner portion, wherein the portion displaced from the corner portion has a wall thickness of 60% or less of a wall thickness at one of the corner portions.

2. The substrate container of claim 1, the substrate supports being substantially formed of the magnesium thixomolded material.

3. The substrate container of claim 1, wherein at least a portion of the substrate container being formed of an injection molded polymer composition.

4. The substrate carrier of claim 1, the substrate container further comprising a component bonded to a coated surface of the magnesium thixomolded material.

5. The substrate container of claim 1, wherein the coating is a conversion coating.

6. The substrate container of claim 1, the coating thickness being $10^{-4}$ to $10^{-5}$ of an inch.

7. The substrate container of claim 5, wherein the conversion coating is selected from the group consisting of Alodine 5200 (Non Chromate), Alodine 5900 (Trivalent Chromate), Metalast TCP-HF; NH35 (Hexavalent Chromate), Tagnite, Anomag, and Keronite.

8. The substrate container of claim 1, wherein at least one wall portion having a thinned portion that is at least 30 percent less than the thickness of a region of at least one of the corner portions.

9. The substrate container of claim 1, further comprising a door, the door being formed of a magnesium thixomolded material.

\* \* \* \* \*